US008032575B2

(12) United States Patent
Oyama

(10) Patent No.: US 8,032,575 B2
(45) Date of Patent: Oct. 4, 2011

(54) DIGITAL SIGNAL PROCESSING APPARATUS AND DIGITAL SIGNAL PROCESSING METHOD

(75) Inventor: Mitsuhiro Oyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1057 days.

(21) Appl. No.: 11/852,877

(22) Filed: Sep. 10, 2007

(65) Prior Publication Data
US 2008/0114825 A1 May 15, 2008

(30) Foreign Application Priority Data

Sep. 11, 2006 (JP) ................................ 2006-245648

(51) Int. Cl.
G06F 17/10 (2006.01)

(52) U.S. Cl. ...................................................... 708/313
(58) Field of Classification Search .................. None
See application file for complete search history.

(56) References Cited

U.S. PATENT DOCUMENTS

| 5,559,513 | A | | 9/1996 | Rothermel et al. |
| 5,856,796 | A | * | 1/1999 | Akune et al. ................... 341/61 |
| 5,903,482 | A | * | 5/1999 | Iwamura et al. .............. 708/313 |
| 5,920,842 | A | * | 7/1999 | Cooper et al. ................ 704/503 |
| 6,487,573 | B1 | | 11/2002 | Jiang et al. |
| 6,668,029 | B1 | | 12/2003 | Koslov et al. |
| 7,609,181 | B2 | * | 10/2009 | Nishioka ......................... 341/61 |

FOREIGN PATENT DOCUMENTS

JP 11-068727 3/1999

* cited by examiner

Primary Examiner — David H Malzahn
(74) Attorney, Agent, or Firm — Turocy & Watson, LLP

(57) ABSTRACT

A digital signal processing apparatus including: an arithmetic circuit that performs first digital signal processing on an input signal SA sampled at a first sampling frequency f1 and second digital signal processing on a result of the first digital signal processing; a timing control circuit that controls and causes the arithmetic circuit to perform the first and second digital signal processing; and a control circuit that monitors in real-time at least one of an amount of data subjected to the second digital signal processing and an amount of data to be transmitted by the input signal SA, and which controls the timing control circuit when the monitored data amount reaches a predetermined value.

20 Claims, 9 Drawing Sheets

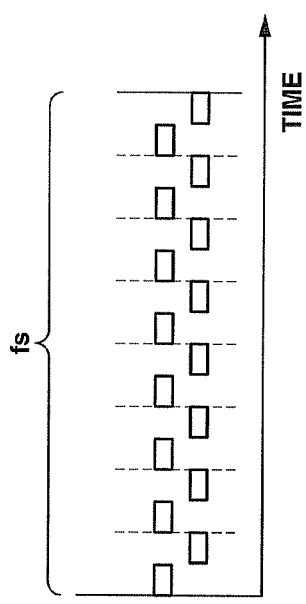
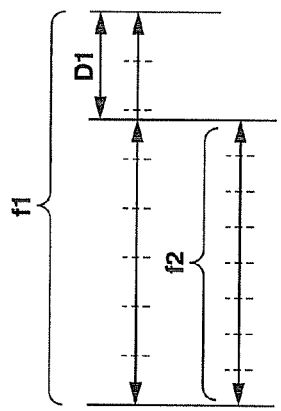
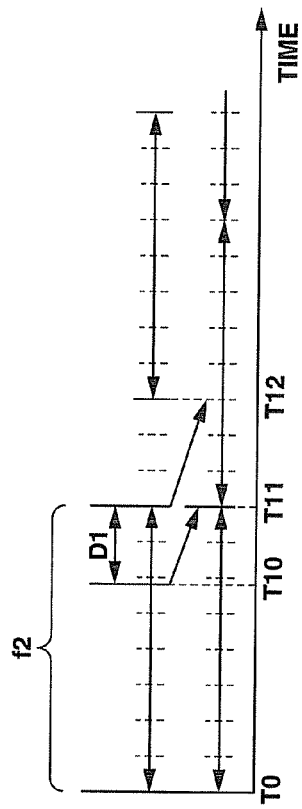
FIG.2A INTERPOLATION PROCESSING
FIG.2B SRC PROCESSING
FIG.3A INTERPOLATION PROCESSING
FIG.3B SRC PROCESSING
FIG.4A INTERPOLATION PROCESSING
FIG.4B SRC PROCESSING

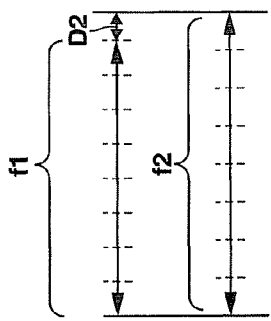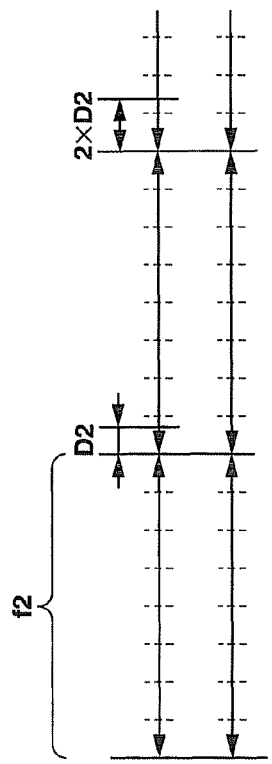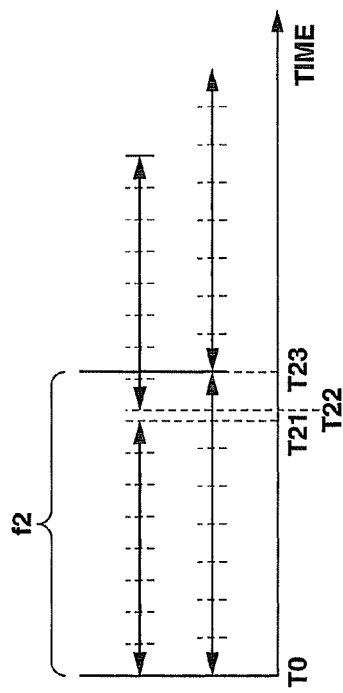
FIG.5A INTERPOLATION PROCESSING
FIG.5B SRC PROCESSING
FIG.6A INTERPOLATION PROCESSING
FIG.6B SRC PROCESSING
FIG.7A INTERPOLATION PROCESSING
FIG.7B SRC PROCESSING

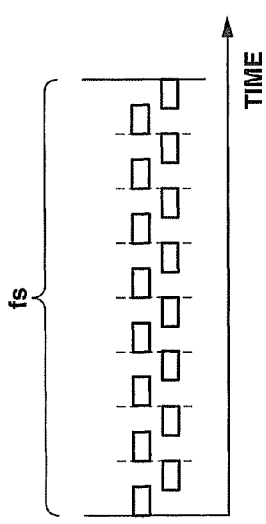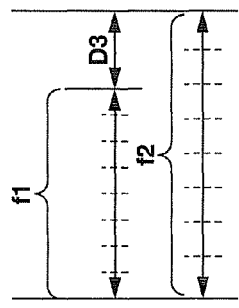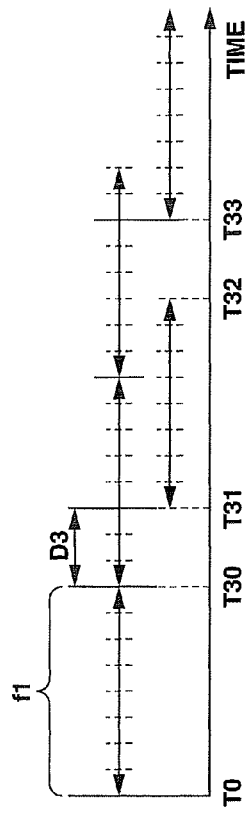

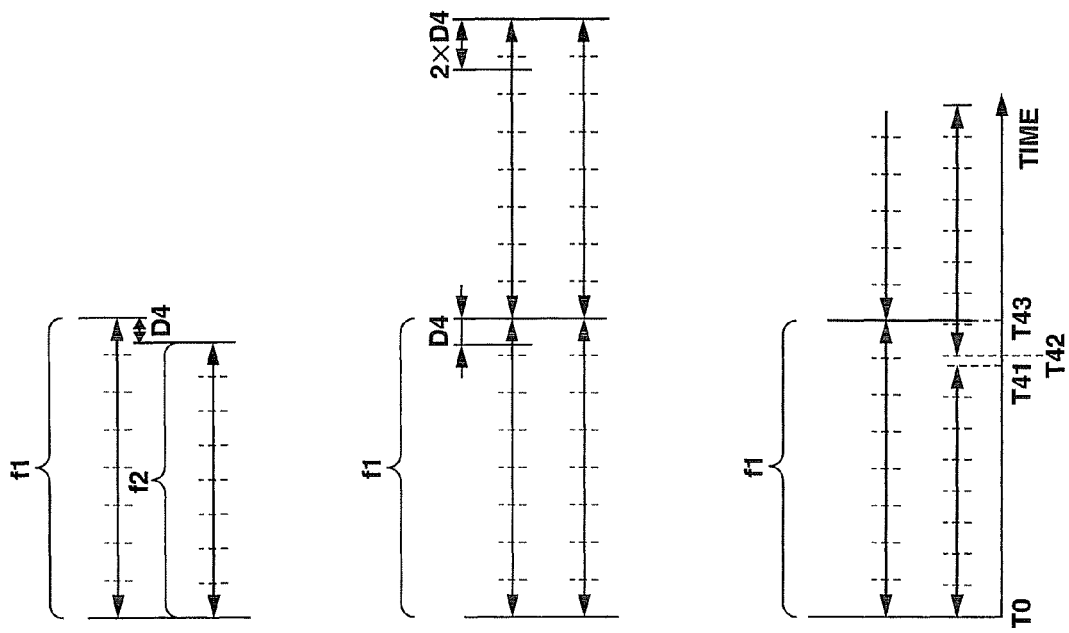
FIG.12A INPUT DATA
FIG.12B SRC PROCESSING
FIG.13A INPUT DATA
FIG.13B SRC PROCESSING
FIG.14A INPUT DATA
FIG.14B SRC PROCESSING

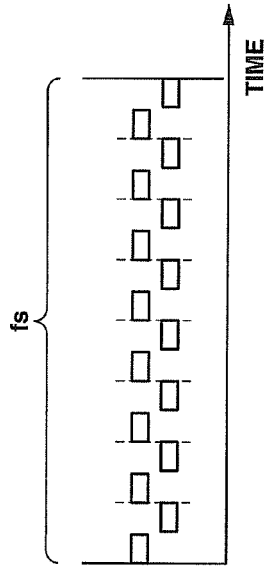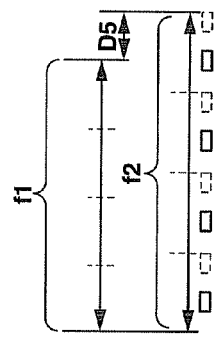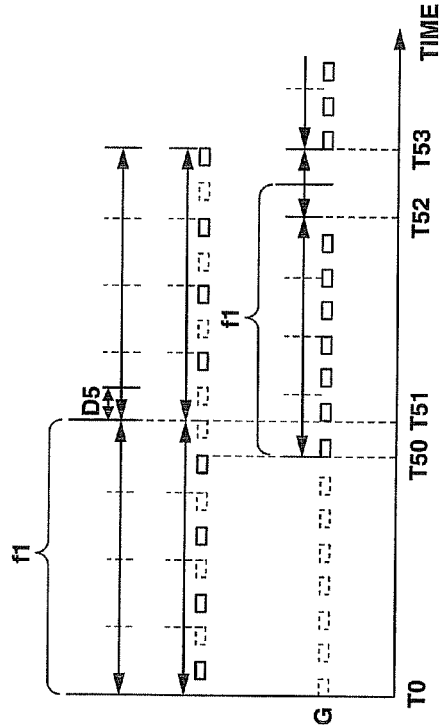
FIG. 16A SRC PROCESSING
FIG. 16B DECIMATION PROCESSING
FIG. 17A INPUT DATA
FIG. 17B SRC PROCESSING
FIG. 18A INPUT DATA
FIG. 18B SRC PROCESSING
FIG. 18C DECIMATION PROCESSING

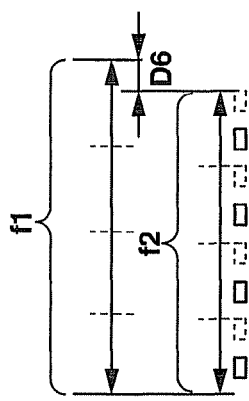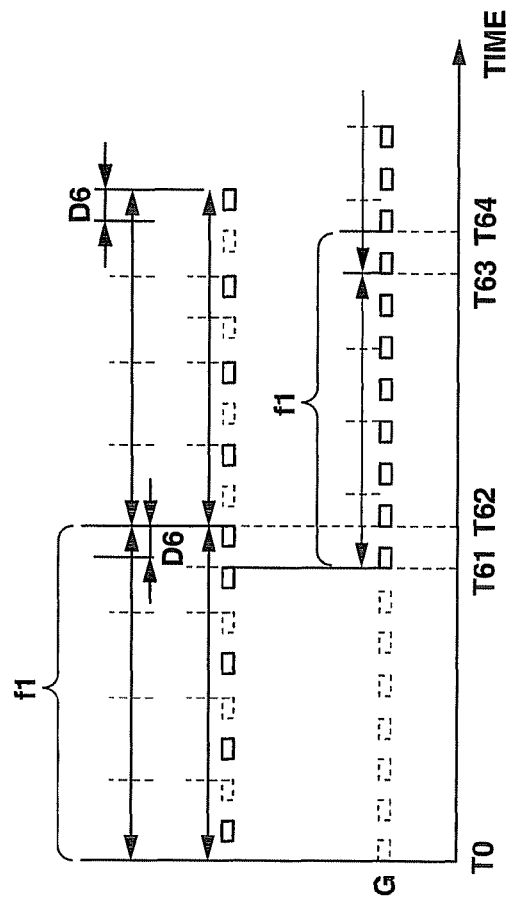
FIG. 19A INPUT DATA
FIG. 19B SRC PROCESSING
FIG. 20A INPUT DATA
FIG. 20B SRC PROCESSING
FIG. 20C DECIMATION PROCESSING

DIGITAL SIGNAL PROCESSING APPARATUS AND DIGITAL SIGNAL PROCESSING METHOD

CROSS-REFERENCE TO RELATED APPLICATION

This application is based upon and claims the benefit of priority from the prior Japanese Patent Application No. 2006-245648 filed on Sep. 11, 2006; the entire contents of which are incorporated herein by reference.

BACKGROUND OF THE INVENTION

1. Field of the Invention

The present invention relates to a digital signal processing apparatus and a digital signal processing method, and particularly, to a digital signal processing apparatus and a digital signal processing method that perform digital signal processing in which the sampling frequency of an input signal differs from the sampling frequency of an output signal.

2. Description of Related Art

When the sampling frequency of an output signal is different from the sampling frequency of an input signal, it is necessary to use a digital signal processing apparatus such as a sampling rate converter that performs sampling rate conversion (SRC). In addition, a further digital signal processing apparatus for performing digital filtering will be required to perform digital filtering such as oversampling processing before and after SRC processing. One of the two digital signal processing apparatuses that are, namely, a sampling rate converter and a digital filter, operates in synchronization with the sampling frequency of the input signal. In other words, the apparatus operates in synchronization with an operation clock that is a fixed multiple of the sampling frequency of the input signal. In addition, the other digital signal processing apparatus operates in synchronization with the sampling frequency of the output signal. In other words, the apparatus operates in synchronization with an operation clock that is a fixed multiple of the sampling frequency of the output signal. Therefore, when the sampling frequency of the output signal is different from the sampling frequency of the input signal, it is necessary to use a plurality of digital signal processing apparatuses that operate in synchronization with different operation clocks. (For instance, refer to Japanese Patent Laid-Open No. H11-68727).

For example, when realizing interpolation processing in which the sampling frequency of the input signal digital data is 32 kHz and the sampling frequency of the output signal digital data is 48 kHz, a digital signal processing apparatus that performs interpolation processing on an operation clock synchronized to 32 kHz is first provided, and a digital signal processing apparatus that performs SRC processing with the interpolation result as input on an operation clock synchronized to 48 kHz is next provided.

As described above, digital signal processing in which the sampling frequencies of the input signal and the output signal differ requires two digital signal processing apparatuses that each operate in synchronization with the respective sampling frequencies. As a result, there is a problem in that the apparatus configuration required by digital signal processing increases, which in turn causes increases in circuit size, power consumption and the like.

BRIEF SUMMARY OF THE INVENTION

According to an aspect of the present invention, there is provided a digital signal processing apparatus including: (a) an arithmetic circuit that performs first digital signal processing on an input signal sampled at a first sampling frequency and second digital signal processing on a result of the first digital signal processing; (b) a timing control circuit that controls and causes the arithmetic circuit to perform first and second digital signal processing; and (c) a control circuit that monitors in real-time at least one of an amount of data subjected to the second digital signal processing and an amount of data to be transmitted by the input signal, and which controls the timing control circuit when the monitored data amount reaches a predetermined value.

BRIEF DESCRIPTION OF THE DRAWINGS

FIG. 2A is a timing chart showing a processing method performed by the digital signal processing apparatus according to the first embodiment of the present invention, and a diagram showing interpolation execution;

FIG. 2B is a timing chart showing a processing method performed by the digital signal processing apparatus according to the first embodiment of the present invention, and a diagram showing SRC execution;

FIG. 3A is a schematic diagram for describing operations of the digital signal processing apparatus according to the first embodiment of the present invention, and a diagram showing an amount of data to be interpolated per processing unit;

FIG. 3B is a schematic diagram for describing operations of the digital signal processing apparatus according to the first embodiment of the present invention, and a diagram showing an amount of data to be SRC processed per processing unit;

FIG. 4A is a timing chart for describing a processing method performed by the digital signal processing apparatus according to the first embodiment of the present invention, and a diagram showing interpolation execution;

FIG. 4B is a timing chart for describing a processing method performed by the digital signal processing apparatus according to the first embodiment of the present invention, and a diagram showing SRC execution;

FIG. 5A is a schematic diagram for describing operations of a digital signal processing apparatus according to a second embodiment of the present invention, and a diagram showing an amount of data to be interpolated per processing unit;

FIG. 5B is a schematic diagram for describing operations of the digital signal processing apparatus according to the second embodiment of the present invention, and a diagram showing an amount of data to be SRC processed per processing unit;

FIG. 6A is a schematic diagram for describing operations of the digital signal processing apparatus according to the second embodiment of the present invention, and a diagram showing an amount of data to be interpolated per processing unit;

FIG. 6B is a schematic diagram for describing operations of the digital signal processing apparatus according to the second embodiment of the present invention, and a diagram showing an amount of data to be SRC processed per processing unit;

FIG. 7A is a timing chart for describing a processing method performed by the digital signal processing apparatus according to the second embodiment of the present invention, and a diagram showing interpolation execution;

FIG. 7B is a timing chart for describing a processing method performed by the digital signal processing apparatus according to the second embodiment of the present invention, and a diagram showing SRC execution;

FIG. 9A is a timing chart showing a processing method performed by the digital signal processing apparatus according to the third embodiment of the present invention, and a diagram showing SRC execution;

FIG. 9B is a timing chart showing a processing method performed by the digital signal processing apparatus according to the third embodiment of the present invention, and a diagram showing decimation execution;

FIG. 10A is a schematic diagram for describing operations of the digital signal processing apparatus according to the third embodiment of the present invention, and a diagram showing an amount of data to be transmitted by an input signal per transmission unit;

FIG. 10B is a schematic diagram for describing operations of the digital signal processing apparatus according to the third embodiment of the present invention, and a diagram showing an amount of data to be SRC processed per processing unit;

FIG. 11A is a timing chart for describing a processing method performed by the digital signal processing apparatus according to the third embodiment of the present invention, and a diagram showing storage of data to be used as SRC input to a ring buffer;

FIG. 11B is a timing chart for describing a processing method performed by the digital signal processing apparatus according to the third embodiment of the present invention, and a diagram showing SRC execution;

FIG. 12A is a schematic diagram for describing operations of a digital signal processing apparatus according to a fourth embodiment of the present invention, and a diagram showing an amount of data to be transmitted by an input signal per transmission unit;

FIG. 12B is a schematic diagram for describing operations of the digital signal processing apparatus according to the fourth embodiment of the present invention, and a diagram showing an amount of data to be SRC processed per processing unit;

FIG. 13A is a schematic diagram for describing operations of the digital signal processing apparatus according to the fourth embodiment of the present invention, and a diagram showing an amount of data to be transmitted by an input signal per transmission unit;

FIG. 13B is a schematic diagram for describing operations of the digital signal processing apparatus according to the fourth embodiment of the present invention, and a diagram showing an amount of data to be SRC processed per processing unit;

FIG. 14A is a timing chart for describing a processing method performed by the digital signal processing apparatus according to the fourth embodiment of the present invention, and a diagram showing storage of data to be used as SRC input to a ring buffer;

FIG. 14B is a timing chart for describing a processing method performed by the digital signal processing apparatus according to the fourth embodiment of the present invention, and a diagram showing SRC execution;

FIG. 16A is a timing chart showing a processing method performed by the digital signal processing apparatus according to the fifth embodiment of the present invention, and a diagram showing SRC execution;

FIG. 16B is a timing chart showing a processing method performed by the digital signal processing apparatus according to the fifth embodiment of the present invention, and a diagram showing decimation execution;

FIG. 17A is a schematic diagram for describing operations of the digital signal processing apparatus according to the fifth embodiment of the present invention, and a diagram showing an amount of data to be transmitted by an input signal per transmission unit;

FIG. 17B is a schematic diagram for describing operations of the digital signal processing apparatus according to the fifth embodiment of the present invention, and a diagram showing an amount of data to be SRC processed per processing unit;

FIG. 18A is a timing chart for describing a processing method performed by the digital signal processing apparatus according to the fifth embodiment of the present invention, and a diagram showing storage of an input signal SA to be used as SRC input data to a ring buffer 17;

FIG. 18B is a timing chart for describing a processing method performed by the digital signal processing apparatus according to the fifth embodiment of the present invention, and a diagram showing SRC execution;

FIG. 18C is a timing chart for describing a processing method performed by the digital signal processing apparatus according to the fifth embodiment of the present invention, and a diagram showing decimation execution;

FIG. 19A is another schematic diagram for describing operations of the digital signal processing apparatus according to the fifth embodiment of the present invention, and a diagram showing an amount of data to be transmitted by an input signal per transmission unit;

FIG. 19B is another schematic diagram for describing operations of the digital signal processing apparatus according to the fifth embodiment of the present invention, and a diagram showing an amount of data to be SRC processed per processing unit;

FIG. 20A is another timing chart for describing a processing method performed by the digital signal processing apparatus according to the fifth embodiment of the present invention, and a diagram showing storage of an input signal SA to be used as SRC input data to the ring buffer 17;

FIG. 20B is another timing chart for describing a processing method performed by the digital signal processing apparatus according to the fifth embodiment of the present invention, and a diagram showing SRC execution; and FIG. 20C is another timing chart for describing a processing method performed by the digital signal processing apparatus according to the fifth embodiment of the present invention, and a diagram showing decimation execution.

DETAILED DESCRIPTION OF THE EMBODIMENTS OF THE INVENTION

Figure 1:
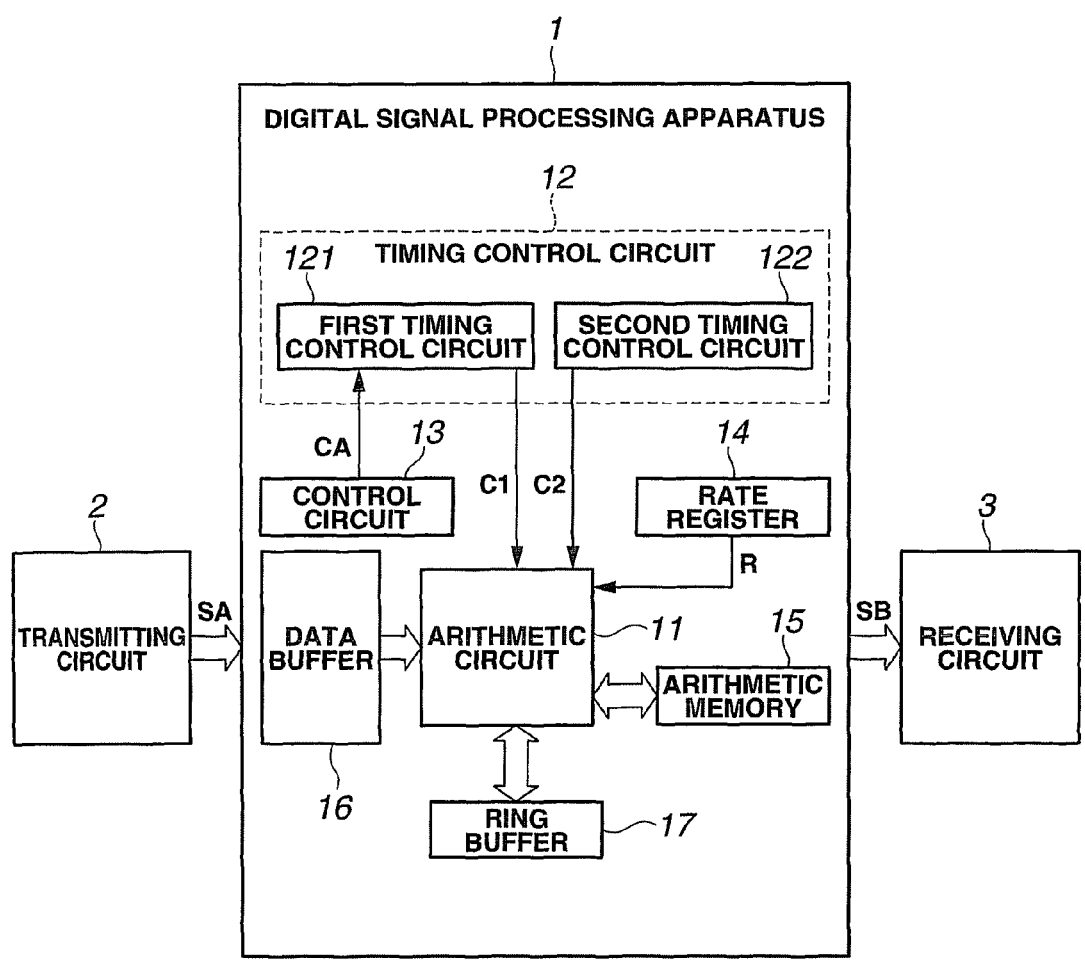
FIG. 1 is a schematic diagram showing a configuration of a digital signal processing apparatus according to a first embodiment of the present invention.

Next, first to fifth embodiments of the present invention will be described with reference to the drawings. In the following description of the drawings, same or like portions are represented by same or like reference characters. In addition, the first to fifth embodiments presented below merely identify apparatuses or methods for embodying the technical ideas of the present invention. The technical ideas of the present invention do not limit the structure, arrangement and the like of the components therein to those described below. Various changes and modifications may be made to the technical ideas of the present invention within the scope of the claims.

First Embodiment

A digital signal processing apparatus 1 according to a first embodiment of the present invention is a digital signal processing apparatus that performs digital signal processing on an input signal SA sampled at a first sampling frequency f1 to generate an output signal SB sampled at a second sampling frequency f2. As shown in FIG. 1, the digital signal processing apparatus 1 includes: an arithmetic circuit 11 that performs first digital signal processing on the input signal SA and second digital signal processing on a result of the first digital signal processing; a timing control circuit 12 that controls and causes the arithmetic circuit 11 to perform first and second digital signal processing; and a control circuit 13 that monitors in real-time at least one of an amount of data subjected to the second digital signal processing and an amount of data to be transmitted by the input signal SA, and which controls the timing control circuit 12 when the monitored data amount reaches a predetermined value.

With the example shown in FIG. 1, a transmitting circuit 2 transmits data sampled at the first sampling frequency f1 by an input signal SA from the transmitting circuit 2 to the digital signal processing apparatus 1. Then, data subjected to digital signal processing by the digital signal processing apparatus 1 will be transmitted by the output signal SB to a receiving circuit 3 that samples data at the second sampling frequency f2.

The timing control circuit 12 includes a first timing control circuit 121 and a second timing control circuit 122. The first timing control circuit 121 transmits to the arithmetic circuit 11 a control signal C1 that instructs first digital signal processing of the input signal SA. The second timing control circuit 122 transmits to the arithmetic circuit 11 a control signal C2 that instructs second digital signal processing of the result of the first digital signal processing.

As described later, when the amount of data to be subjected to the first digital signal processing per processing unit is greater than the amount of data to be subjected to the second digital signal processing, the control circuit 13 controls the timing control circuit 12 so that the timing upon which the first digital signal processing is commenced arrives later than the timing upon which the second digital signal processing is commenced. Alternatively, when the amount of data to be subjected to the first digital signal processing per processing unit is less than the amount of data to be subjected to the second digital signal processing, the control circuit 13 controls the timing control circuit 12 so that the timing upon which the first digital signal processing is commenced arrives earlier than the timing upon which the second digital signal processing is commenced.

The first and second digital signal processing are executed on a sampling frequency basis. For example, a case where digital signal processing is performed on one piece of input data within one period of a sampling frequency to output eight pieces of data shall be described as "performing processing where input data is 1 fs and output data is 8 fs." In this case, "fs" represents a piece of the number of input/output data per processing unit. Processed data is outputted at regular intervals.

The digital signal processing apparatus 1 according to the first embodiment of the present invention further includes a rate register 14, an arithmetic memory 15, a data buffer 16 and a ring buffer 17.

The rate register 14 stores a rate R that is the ratio of the first sampling frequency f1 that is the sampling frequency of the input signal to the second sampling frequency f2 that is the sampling frequency of the output signal SB. The rate R stored in the rate register 14 is used as a sampling rate of SRC processing and the like.

The arithmetic memory 15 provides temporary storage for result of arithmetic operations executed by the arithmetic circuit 11 and the like. The data buffer 16 provides temporary storage for the input signal SA to be transmitted from the transmitting circuit 2 to the digital signal processing apparatus 1. The ring buffer 17 provides temporary storage for result of first digital signal processing. A random access memory (RAM) or the like may be used as the arithmetic memory 15, the data buffer 16 and the ring buffer 17.

The digital signal processing apparatus 1 operates in synchronization with an operation clock that is a fixed multiple of the second sampling frequency f2. In other words, the operation clock of the digital signal processing apparatus 1 is the same as that of the receiving circuit 3. In this case, "fixed multiple" refers to, for example, 384-fold, 512-fold, 1024-fold and the like, and is dependent on system specification.

A description will be given below on an example in which the digital signal processing apparatus 1 shown in FIG. 1 performs interpolation for generating an interpolated data signal from the input signal SA as the first digital signal processing and performs SRC processing on the interpolation processing result as the second digital signal processing. It is assumed that the first sampling frequency f1 is 32 kHz while the second sampling frequency f2 is 44.1 kHz. The ratio of the first sampling frequency f1=32 kHz to the second sampling frequency f2=44.1 kHz is stored as the rate R in the rate register 14. The rate R is, for instance, 0.72562.

The necessary number of bits for the rate R stored in the rate register 14 will be described as follows. For instance, to have the digital signal processing apparatus 1 achieve an accuracy equal to or greater than a crystal oscillator with an accuracy of 100 ppm, 14 decimal bits are required for the number of bits of the rate R. Therefore, assuming that the integer portion has 5 bits, the digital signal processing apparatus 1 may achieve an accuracy equal to or greater than 100 ppm by arranging the number of bits of the rate R to be 19 or more. An example of a method for calculating the number of bits of the rate R is shown below.

(A) If the accuracy of the crystal oscillator is 100 ppm (=0.001%), calculate an integer x that satisfies the following equation (1):

$$0.001\% > (\tfrac{1}{2}^x) \qquad (1)$$

From equation (1), we get $2^x=10000$. Therefore, x>14. ($2^{14}=16384$).

(B) If the accuracy of the crystal oscillator is 10 ppm (=0.00001%), calculate an integer x that satisfies the following equation (2):

$$0.0001\% > (\tfrac{1}{2}^x) \qquad (2)$$

From equation (2), we get $2^x=100000$. Therefore, x>17. ($2^{17}=131072$). In other words, when setting the accuracy of the digital signal processing apparatus 1 to 10 ppm or higher, the rate R requires 17 decimal bits. Thus, a rate R set according to the above-described method so that the result of digital signal processing has a desired accuracy is stored in advance in the rate register 14.

Conceptual diagrams of digital signal processing per processing unit executed by the digital signal processing apparatus 1 are shown in FIGS. 2A and 2B. As shown in FIGS. 2A and 2B, since the digital signal processing apparatus 1 executes interpolation and SRC processing with one arithmetic circuit 11, the two digital signal processing operations are executed through time division. With the interpolation shown in FIG. 2A, input data per processing unit is 1 fs while output data is 8 fs. In other words, one piece of data will be interpolated as a processing unit within a period of time corresponding to one sampling frequency. Subsequently, interpolated data is created through interpolation and eight times the input data is outputted at regular intervals.

To further describe the digital signal processing shown in FIGS. 2A and 2B, the arithmetic circuit 11 is controlled by the control signal C1 to be transmitted from the first timing control circuit 121 to read out data necessary for interpolation per processing unit from data to be transmitted from the transmitting circuit 2 by the input signal SA and stored in the data buffer 16. The arithmetic circuit 11 performs interpolation on the read-out data. Data obtained from the interpolation is stored in the ring buffer 17. In addition, the arithmetic circuit 11 is controlled by the control signal C2 to be transmitted from the second timing control circuit 122 to read out interpolated data from the ring buffer 17. The arithmetic circuit 11 performs SRC processing on the data read out from the ring buffer 17, and outputs the SRC processed data at regular intervals. At this point, the arithmetic circuit 11 performs SRC processing by referencing the rate R stored in the rate register 14.

In the above example, the first sampling frequency f1 (32 kHz) is approximately 0.72562 times the second sampling frequency f2 (44.1 kHz). Therefore, when performing interpolation processing and SRC processing in synchronization with an operation clock that is a fixed multiple of the second sampling frequency f2, the amount of data to be interpolated per processing unit is greater than the amount of data to be SRC processed per processing unit. For example, as shown in FIGS. 3A and 3B, when consecutively executing interpolation and SRC processing, excess data having a data amount of D1 is created per processing unit on which interpolation processing is performed but SRC processing is not performed.

A method by which the control circuit 13 of the digital signal processing apparatus 1 controls the timing control circuit 12 in a case where excess data is created will now be described using the timing charts shown in FIGS. 4A and 4B. First, the first timing control circuit 121 transmits the control signal C1 to the arithmetic circuit 11, and causes the arithmetic circuit 11 to commence interpolation of the input signal SA at time T0. The arithmetic circuit 11 performs interpolation of one processing unit during one period of the second sampling frequency f2. Then, after the conclusion of interpolation of one processing unit at time T11, the transmission of the control signal C1 from the first timing control circuit 121 to the arithmetic circuit 11 is stopped and the arithmetic circuit 11 stops interpolation. On the other hand, the second timing control circuit 122 transmits the control signal C2 to the arithmetic circuit 11, and causes the arithmetic circuit 11 to execute SRC processing on the interpolation processing result.

The control circuit 13 monitors the SRC processed data amount in real-time, and when the amount of SRC processed data reaches a predetermined value, the control circuit 13 transmits a control signal CA to the timing control circuit 12. More specifically, at time T12 upon which the SRC processing on the interpolation processed data of one processing unit is concluded, the control circuit 13 transmits the control signal CA to the first timing control circuit 121. Upon receiving the control signal CA, the first timing control circuit 121 recommences transmission of the control signal C1 to the arithmetic circuit 11, whereby the arithmetic circuit 11 newly performs interpolation of one processing unit on the input signal SA. In other words, after conclusion of the interpolation of one processing unit on the input signal SA, interpolation is interrupted until the control signal CA is transmitted to the first timing control circuit 121.

The second timing control circuit 122 transmits the control signal C2 to the arithmetic circuit 11 in synchronization with the second sampling frequency f2. As a result, SRC processing will be constantly executed, and SRC processing result will be outputted at regular intervals.

In the example shown in FIGS. 4A and 4B, the amount of interpolated data from the start of processing to time T10 corresponds to the amount of data to be SRC processed per processing unit. In addition, data interpolated between time T10 and time T11 will be subjected to SRC processing between time T11 and time T12. In other words, interpolation is recommenced at time T12 upon which all interpolated data per processing unit is SRC processed.

As described above, with the digital signal processing apparatus 1 according to the first embodiment of the present invention, when the first sampling frequency f1 is lower than the second sampling frequency f2 or, in other words, when the amount of data subjected to interpolation processing (first digital signal processing) per processing unit is greater than the amount of data subjected to SRC processing (second digital signal processing), the timing control circuit 12 is controlled so that interpolation is newly commenced when the amount of SRC processed data reaches the amount of data to be SRC processed per processing unit. In other words, interpolation is stopped until SRC processing on interpolated data is concluded. Therefore, when the amount of data to be interpolated per processing unit is greater than the amount of data to be SRC processed, generation of excess data with respect to SRC processing may be resolved. As a result, interpolation processing and SRC processing may be executed by one arithmetic circuit 11. In turn, increases in apparatus configuration required by digital signal processing in which the first sampling frequency f1 of the input signal SA differs from the second sampling frequency f2 of the output signal SB may be suppressed, and a digital signal processing apparatus 1 that operates at one operation clock may be realized. As a result, increases in circuit size, power consumption and the like of the digital signal processing apparatus 1 may be suppressed.

Second Embodiment

For the first embodiment, a case where the sampling frequency of the input signal SA is lower than the sampling frequency of the output signal SB was described. A description will be given below on a case where the sampling frequency of the input signal SA is higher than the sampling frequency of the output signal SB. A case will now be described where interpolation is executed in which the first sampling frequency f1 that is the sampling frequency of the input signal SA is 48 kHz and the second sampling frequency f2 that is the sampling frequency of the output signal SB is 44.1 kHz. As the ratio of the first sampling frequency f1 to the second sampling frequency f2, rate R is set to, for example, 1.08834.

The first sampling frequency f1 (48 kHz) is approximately 1.08834 times the second sampling frequency f2 (44.1 kHz). Therefore, when performing interpolation and SRC processing by the digital signal processing apparatus 1 shown in FIG. 1 in synchronization with an operation clock that is a fixed multiple of the second sampling frequency f2, the amount of data to be processed per processing unit is greater for SRC than for interpolation processing.

As a result, at the time of conclusion of interpolation, there will be a deficiency of data after interpolation to be subjected to SRC. For example, as shown in FIGS. 5A and 5B, for SRC processing on the interpolation result in a case where the input data per processing unit is 1 fs and the output data is 8 fs, deficiency of data having a data amount of D2 will be generated. When the arithmetic circuit 11 performs interpolation of one processing unit during one period of the second sampling frequency f2, deficiency of data having a data amount of D2 will be generated for each processing unit of interpolation, as shown in FIGS. 6A and 6B.

A method by which the control circuit 13 of the digital signal processing apparatus 1 controls the timing control circuit 12 in a case where deficiency of data is created will now be described using the timing charts shown in FIGS. 7A and 7B. As shown in FIGS. 7A and 7B, the first timing control circuit 121 controls the arithmetic circuit 11 to cause interpolation of one processing unit that was commenced at time T0 to be concluded at time T21. After the conclusion of interpolation of one processing unit at time T21, the transmission of the control signal C1 from the first timing control circuit 121 to the arithmetic circuit 11 is stopped and the arithmetic circuit 11 stops interpolation. Assuming that the time upon which SRC processing of one processing unit is concluded is T23, the interval from time T21 to time T23 is set to be equal to or longer than the period of time during which the arithmetic circuit 11 outputs interpolation result of data amount D2. On the other hand, the second timing control circuit 122 transmits the control signal C2 to the arithmetic circuit 11, and causes the arithmetic circuit 11 to execute SRC processing on the interpolation processing result.

The control circuit 13 monitors the amount of SRC processed data in real-time, and when the amount of SRC processed data reaches a predetermined value, transmits a control signal CA to the timing control circuit 12. As shown in FIGS. 7A and 7B, before the conclusion of SRC processing, the control circuit 13 transmits the control signal CA to the first timing control circuit 121 at time T22. In this case, time T22 is set so that the interpolation result during the period from time T22 to time T23 equals or exceeds the data amount D2. In other words, time T22, upon which interpolation is newly commenced, is set so that the amount of data to be interpolated from time T22 until time T23 upon which the SRC currently being executed is concluded is equal to or greater than the difference between the amount of data to be interpolated per processing unit and the amount of data to be SRC processing. The control circuit 13 transmits the control signal CA to the first timing control circuit 121 at time T22.

Upon receiving the control signal CA, the first timing control circuit 121 recommences transmission of the control signal C1 to the arithmetic circuit 11, whereby the arithmetic circuit 11 newly performs interpolation on the input signal SA. The second timing control circuit 122 transmits the control signal C2 to the arithmetic circuit 11 in synchronization with the second sampling frequency f2. As a result, SRC processing will be constantly executed, and SRC processing result will be outputted at regular intervals.

As described above, with the digital signal processing apparatus 1 according to the second embodiment of the present invention, when the first sampling frequency f1 is higher than the second sampling frequency f2 or, in other words, when the amount of data subjected to interpolation processing (first digital signal processing) per processing unit is less than the amount of data subjected to SRC processing (second digital signal processing), the timing control circuit 12 is controlled so that interpolation is newly commenced before the conclusion of SRC processing on the interpolation result of one processing unit. Therefore, when the amount of data subjected to interpolation per processing unit is less than the amount of data subjected to SRC processing, the deficiency of data necessary for SRC processing may be resolved. As a result, interpolation processing and SRC processing may be executed by one arithmetic circuit 11. Other features are substantially equal to those of the first embodiment, and overlapping descriptions will be omitted.

Third Embodiment

Figure 8:
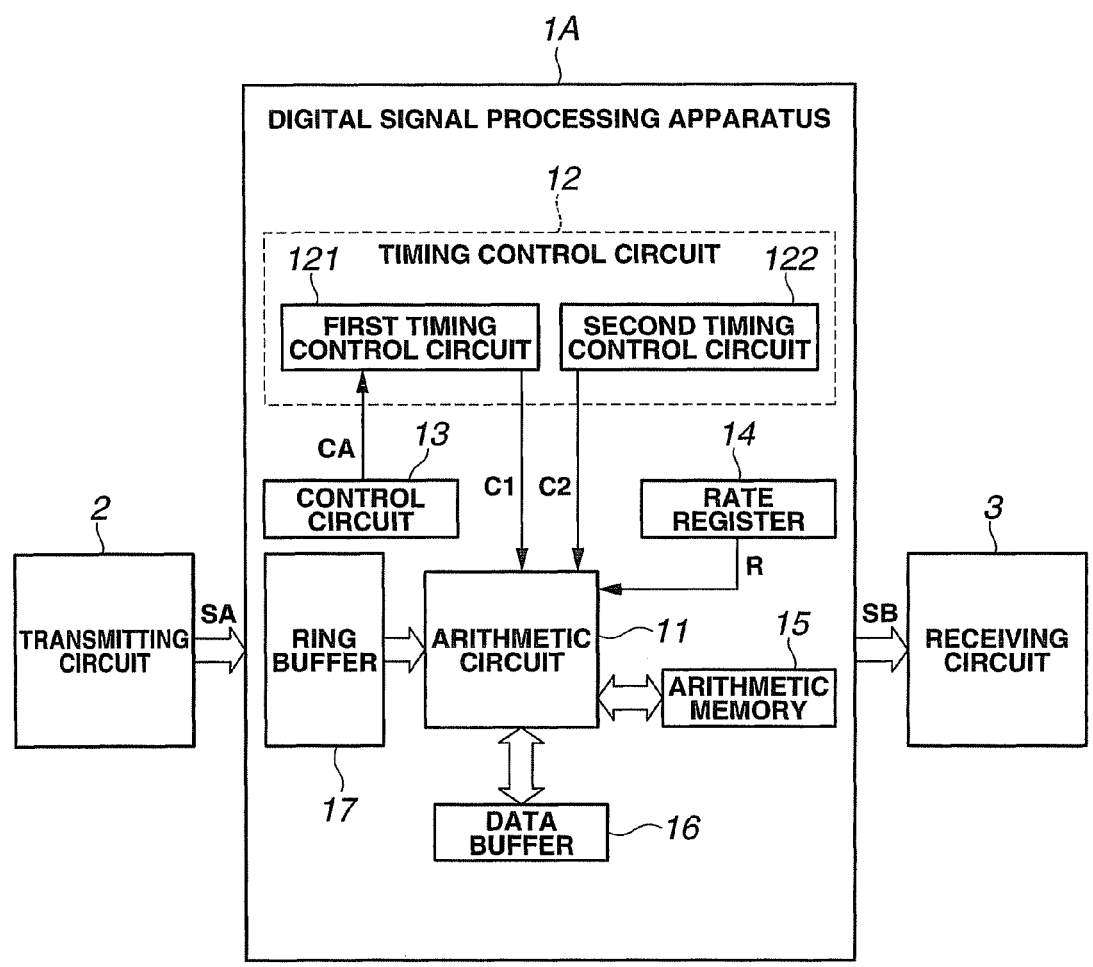
FIG. 8 is a schematic diagram showing a configuration of a digital signal processing apparatus according to a third embodiment of the present invention.

As shown in FIG. 8, a digital signal processing apparatus 1A according to a third embodiment of the present invention differs from FIG. 1 in that an input signal SA transmitted from the transmitting circuit 2 to the digital signal processing apparatus 1 is temporarily stored in the ring buffer 17 and the processing result of first digital signal processing is temporarily stored in the data buffer 16. In addition, the digital signal processing apparatus 1A operates in synchronization with an operation clock that is a fixed multiple of the first sampling frequency f1. In other words, the operation clock of the digital signal processing apparatus 1A is the same as that of the transmitting circuit 2. Other configurations are the same as the first embodiment shown in FIG. 1.

A description will be given below on an example in which the digital signal processing apparatus 1A shown in FIG. 8 performs SRC processing on the input signal SA as the first digital signal processing and performs decimation on the SRC processing result for thinning out data as the second digital signal processing. In the following description, it is assumed that the input data and output data per processing unit of decimation are respectively 8 fs and 1 fs, the first sampling frequency f1 is 44.1 kHz, and the second sampling frequency f2 is 32 kHz. In other words, 8 pieces of data are processed as a processing unit within a period of time corresponding to one sampling frequency, and one piece of decimated data is outputted for each processing unit. In addition, the ratio of the first sampling frequency f1=44.1 kHz to the second sampling frequency f2=32 kHz is stored as the rate R in the rate register 14. The rate R is, for instance, 1.378125.

Conceptual diagrams of digital signal processing per processing unit executed by the digital signal processing apparatus 1A are shown in FIGS. 9A and 9B. As shown in FIGS. 9A and 9B, since the digital signal processing apparatus 1A executes SRC processing and decimation with one arithmetic circuit 11, the two digital signal processing operations are executed through time division.

To further describe the digital signal processing shown in FIGS. 9A and 9B, the arithmetic circuit 11 is controlled by the control signal C1 transmitted from the first timing control circuit 121 to perform SRC processing taking the input signal SA transmitted from the transmitting circuit 2 at regular intervals and stored in the data buffer 17 as input data and to output processing result at regular intervals of 8 fs per processing unit. At this point, the arithmetic circuit 11 performs SRC processing by referencing the rate R stored in the rate register 14. In addition, the arithmetic circuit 11 is controlled by the control signal C2 transmitted from the second timing control circuit 122 to perform decimation on the SRC processing result. Decimation commences when a certain amount of data (8 fs) is outputted through SRC processing, and data of one processing unit (1 fs) is written into the data buffer 16 during one period of the second sampling frequency f2. Data written into the data buffer 16 will be transmitted to the receiving circuit 3 by the output signal SB. Moreover, data transmitted by the input signal SA from the transmitting circuit 2 to the digital signal processing apparatus 1A during a period of time corresponding to one sampling frequency fs shall be hereinafter referred to as "one transmission unit of data."

The first sampling frequency f1 (44.1 kHz) is approximately 1.378125 times the second sampling frequency f2 (32 kHz). Therefore, when performing SRC processing and decimation by the digital signal processing apparatus 1A in synchronization with an operation clock that is a fixed multiple of the first sampling frequency f1, the amount of data to be SRC processed per processing unit is greater than the data amount of one transmission unit. In other words, when storing data corresponding to 1 fs of the first sampling frequency f1 in the ring buffer 17 and performing SRC processing using the rate R, a deficiency of data to be subjected to SRC processing will occur. For example, as shown in FIGS. 10A and 10B, deficiency of data having a data amount of D3 will occur for each SRC processing unit.

A method by which the control circuit 13 of the digital signal processing apparatus 1A controls the timing control circuit 12 in a case where deficiency of data is occurred will now be described using the timing charts shown in FIGS. 11A and 11B. FIG. 11A shows storage of data to become SRC processing input to the ring buffer 17, while FIG. 11B shows SRC processing execution.

As shown in FIGS. 11A and 11B, an input signal SA transmitted from the transmitting circuit 2 from time T0 to time T30 is stored in the ring buffer 17. Furthermore, during the period of time from time T30 to time T31, an input signal SA corresponding to the data amount D3 is stored in the ring buffer 17.

The control circuit 13 monitors the amount of data transmitted by the input signal SA in real-time, and when the amount of data stored in the ring buffer 17 reaches a predetermined value, transmits a control signal CA to the timing control circuit 12. More specifically, at time T31 upon which the amount of data stored in the ring buffer 17 reaches the amount of data to be SRC processed per processing unit, the control circuit 13 transmits the control signal CA to the first timing control circuit 121.

Upon receiving the control signal CA, the first timing control circuit 121 commences transmission of the control signal C1 to the arithmetic circuit 11, whereby the arithmetic circuit 11 performs SRC processing on the input signal SA. Upon conclusion of SRC processing of one processing unit at time T32, SRC processing is stopped by the first timing control circuit 121. Subsequently, at time T33, when the amount of data stored in the ring buffer 17 from time T31 and afterwards reaches the amount of data to be SRC processed per processing unit, the control circuit 13 transmits the control signal CA to the first timing control circuit 121, and SRC processing is recommenced.

As described above, with the digital signal processing apparatus 1A according to the third embodiment of the present invention, when the first sampling frequency f1 is higher than the second sampling frequency f2 or, in other words, when the amount of data to be SRC processed per processing unit is greater than the data amount of a transmission unit, the timing control circuit 12 is controlled so that SRC processing is commenced at the point in time upon which the amount of data to be transmitted by the input signal SA reaches the amount of data to be subjected to SRC processing (first digital signal processing) per processing unit. In other words, after conclusion of SRC processing, SRC processing is interrupted until new data necessary for each processing unit of SRC processing is stored in the ring buffer 17. Therefore, when the amount of data necessary for SRC processing per processing unit is less than the amount of data of a transmission unit, deficiency of data necessary for SRC processing may be resolved. As a result, SRC processing and decimation processing may be executed by one arithmetic circuit 11. Other features are substantially equal to those of the first embodiment, and overlapping descriptions will be omitted.

Fourth Embodiment

For the third embodiment, a case where the sampling frequency of the input signal SA is higher than the sampling frequency of the output signal SB was described. A description will be given below on a case where the sampling frequency of the input signal SA is lower than the sampling frequency of the output signal SB. A case will now be described where decimation is executed in which the first sampling frequency f1 that is the sampling frequency of the input signal SA is 44.1 kHz and the second sampling frequency f2 that is the sampling frequency of the output signal SB is 48 kHz. As the ratio of the first sampling frequency f1 to the second sampling frequency f2, rate R is set to, for example, 0.91875.

The first sampling frequency f1 (44.1 kHz) is approximately 0.91875 times the second sampling frequency f2 (48 kHz). Therefore, when performing SRC and decimation by the digital signal processing apparatus 1A shown in FIG. 8 in synchronization with an operation clock that is a fixed multiple of the first sampling frequency f1, the amount of data to be SRC processed per processing unit is less than the data amount of one transmission unit. In other words, when storing data corresponding to 1 fs of the first sampling frequency f1 in the ring buffer 17 and performing SRC processing using the rate R, for example, data not SRC processed and having a data amount of D4 is stored as excess data in the ring buffer 17 as shown in FIGS. 12A and 12B. When the arithmetic circuit 11 performs SRC processing of one processing unit during one period of the first sampling frequency f1, excess data having a data amount of D4 will be generated for each processing unit of SRC processing, as shown in FIGS. 13A and 13B.

A method by which the control circuit 13 of the digital signal processing apparatus 1A controls the timing control circuit 12 in a case where excess data is generated will now be described using the timing charts shown in FIGS. 14A and 14B. FIG. 14A shows storage of data to become SRC processing input to the ring buffer 17, while FIG. 14B shows SRC processing execution.

As shown in FIGS. 14A and 14B, the first timing control circuit 121 controls the arithmetic circuit 11 to cause SRC processing of one processing unit that was commenced at time T0 to be concluded at time T41. Assuming that the point in time upon which data corresponding to 1 fs of the first sampling frequency f1 is stored in the ring buffer 17 is time T43, the interval between time T41 and time T43 is set so as to equal or exceed the period of time during which the arithmetic circuit 11 executes SRC processing of the data amount D4. After the conclusion of SRC processing of one processing unit at time T41, the transmission of the control signal C1 from the first timing control circuit 121 to the arithmetic circuit 11 is stopped and the arithmetic circuit 11 stops SRC processing.

The control circuit 13 monitors the amount of data to be transmitted by the input signal SA in real-time, and when the amount of data stored in the ring buffer 17 reaches a predetermined value, transmits a control signal CA to the timing control circuit 12. More specifically, after conclusion of SRC processing at time T41 and before time T43, the control circuit 13 transmits a control signal CA to the first timing control circuit 121 at time T42. Time T42, upon which SRC processing is newly commenced, is set so that the amount of data to be transmitted by the input signal SA from time T42 to time T43 upon which the transmission currently in progress of data of one transmission unit is concluded is equal to or exceeds the difference (data amount D4) between the amount of data per transmission unit that is transmitted by the input signal SA and the amount of data to be SRC processed per processing unit.

The control circuit 13 transmits the control signal CA to the first timing control circuit 121 at time T42. Upon receiving the control signal CA, the first timing control circuit 121 recommences transmission of the control signal C1 to the arithmetic circuit 11, whereby the arithmetic circuit 11 newly performs SRC processing of one processing unit on the input signal SA.

As described above, with the digital signal processing apparatus 1A according to the fourth embodiment of the present invention, when the first sampling frequency f1 is lower than the second sampling frequency f2 or, in other words, when the amount of data to be SRC processed per processing unit is less than the data amount of a transmission unit that is transmitted by the input signal SA, the timing control circuit 12 is controlled so that SRC processing is newly commenced before the data of one transmission unit is stored in the ring buffer 17. Therefore, the occurrence of excess data with respect to SRC processing may be resolved. As a result, SRC processing and decimation processing may be executed by one arithmetic circuit 11. Other features are substantially equal to those of the third embodiment, and overlapping descriptions will be omitted.

Fifth Embodiment

Figure 15:
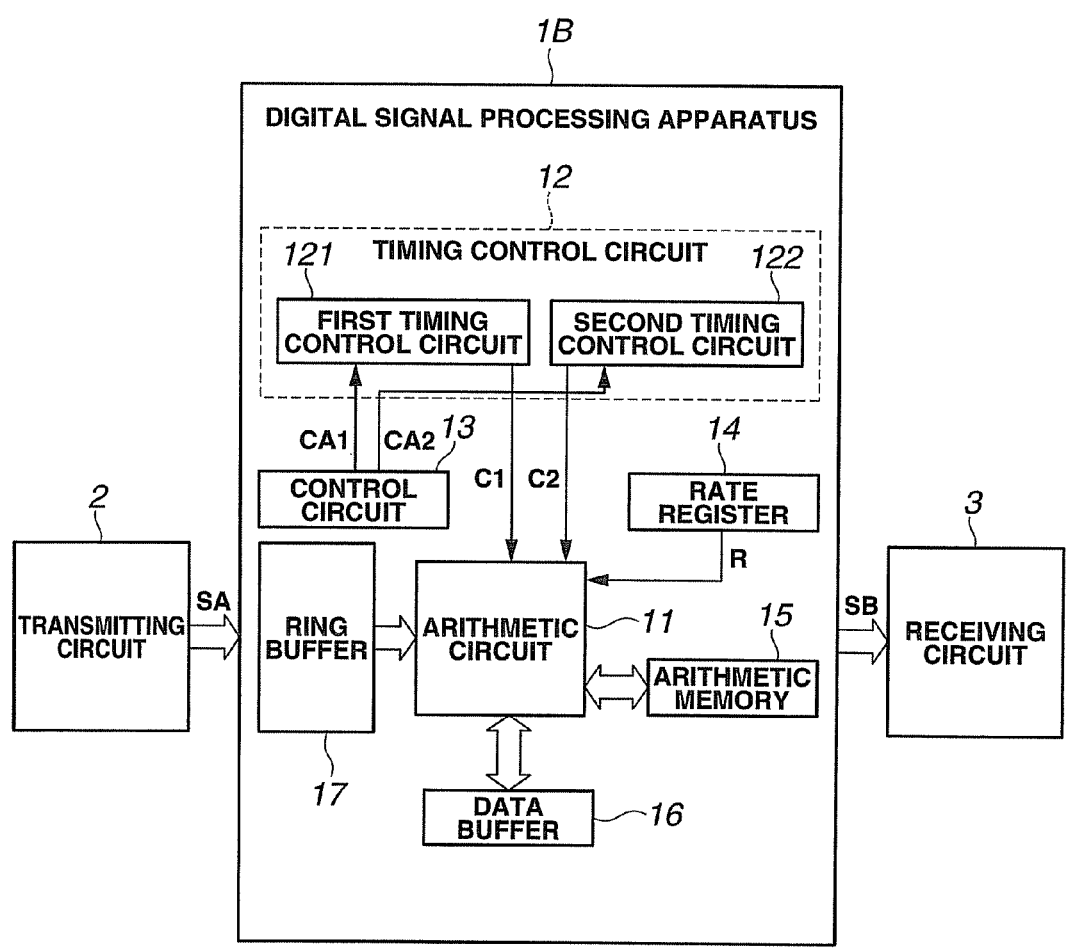
FIG. 15 is a schematic diagram showing a configuration of a digital signal processing apparatus according to a fifth embodiment of the present invention.

As shown in FIG. 15, a digital signal processing apparatus 1B according to a fifth embodiment of the present invention differs from FIG. 8 in that the control circuit 13 is now responsible for transmitting control signals CA1 and CA2 to the timing control circuit 12. Other configurations are the same as the third embodiment shown in FIG. 8. The control signal CA1 is a signal for instructing the timing control circuit 12 on a per-control processing unit basis whether the first digital signal processing will be executed. A description on the "control processing unit" will be given later. The control signal CA2 is transmitted to the timing control circuit 12 when the amount of data subjected to the first digital signal processing reaches a specified value.

A description will be given below on an example in which the digital signal processing apparatus 1B shown in FIG. 15 performs SRC processing on an input signal SA as the first digital signal processing and performs decimation processing on the SRC processing result as the second digital signal processing. In the following, it is assumed that the input data of decimation processing per processing unit is 4 fs and the output data is 1 fs, the first sampling frequency f1 is 44.1 kHz, and the second sampling frequency f2 is 32 kHz or 48 kHz. When the second sampling frequency f2 is 32 kHz, as a ratio of the first sampling frequency f1=44.1 kHz to the second sampling frequency f2=32 kHz, for instance, a rate R of 1.378125 is stored in the rate register 14. When the second sampling frequency f2 is 48 kHz, as a ratio of the first sampling frequency f1=44.1 kHz to the second sampling frequency f2=48 kHz, for instance, a rate R of 0.91875 is stored in the rate register 14.

Since the digital signal processing apparatus 1B shown in FIG. 15 executes SRC processing and decimation processing by one arithmetic circuit 11, the two digital signal processing operations are executed through time division. The arithmetic circuit 11 is controlled by the control signal C1 transmitted from the first timing control circuit 121 and performs SRC processing using as input data the input signal SA that is transmitted at regular intervals from the transmitting circuit 2 and stored in the ring buffer 17. Normal output data of SRC processing per processing unit time is 4 fs. At this point, the arithmetic circuit 11 performs SRC processing by referencing the rate R stored in the rate register 14. However, as shown in FIG. 16A, it is assumed that the maximum data which is able to be output during one period of the sampling frequency is 8 fs in SRC processing. In other words, the timing control circuit 12 is capable of controlling SRC processing by the arithmetic circuit 11 by ⅛ of a period of the sampling frequency. The processing unit to be SRC processed in ⅛ of a period of the sampling frequency shall be referred to as a "control processing unit." A control processing unit is a unit of digital signal processing resulting from splitting the processing unit that is a sampling frequency unit into a plurality of portions.

In addition, the arithmetic circuit 11 shown in FIG. 15 is controlled by the control signal C2 transmitted from the second timing control circuit 122 to perform decimation processing on the SRC processed data, and writes the processing result into the data buffer 16. Data written into the data buffer 16 is transmitted to the receiving circuit 3 by the output signal SB.

With the digital signal processing apparatus 1B shown in FIG. 15, SRC processing is constantly executed in synchronization with an operation clock that is a fixed multiple of the first sampling frequency f1. However, since 4 fs of SRC processing result are normally outputted for each single processing unit, in reality, input data is not read, and an unprocessed control processing unit exists for which output data is not outputted. Hereinafter, a control processing unit on which signal processing is not actually executed shall be referred to as "execution of unprocessing." In addition, actually executing processing for reading input data and writing output data into the data buffer 16 shall be hereinafter referred to as "execution of actual processing."

On the other hand, when the second sampling frequency f2 is 32 kHz, the first sampling frequency f1 is approximately 0.91875 times the second sampling frequency f2. Therefore, as described with respect to the fourth embodiment, when performing SRC processing and decimation processing by the digital signal processing apparatus 1B in synchronization with an operation clock that is a fixed multiple of the first sampling frequency f1, the amount of data to be SRC processed per processing unit is less than the data amount of one transmission unit. In other words, excess data is generated for each SRC processing unit The control circuit 13 of the digital signal processing apparatus 1B controls the timing control circuit 12 according to whether deficient data or excess data is generated for each SRC processing. In other words, the control circuit 13 transmits a control signal CA1 to the timing control circuit 12 according to the first sampling frequency f1 and the second sampling frequency f2, and instructs the timing control circuit 12 on a per-control processing unit basis on whether SRC processing is to be actually executed.

A case will be considered below in which data having a data amount of D5 is generated as deficient data as shown in FIGS. 17A and 17B. In FIG. 17B, execution of actual processing of SRC processing per control processing unit is represented by solid line squares, while execution of unprocessing is represented by dashed line squares (likewise hereinafter). Normally, as shown in FIGS. 17A and 17B, actual processing and unprocessing of SRC processing are alternately executed on a per-control processing unit basis at the digital signal processing apparatus 1B shown in FIG. 15.

Operations performed by the digital signal processing apparatus 1B in a case where deficient data shown in FIGS. 17A and 17B is created will be described with reference to the timing charts shown in FIGS. 18A, 18B and 18C. FIG. 18A shows storage of the input signal SA to become SRC processing input data to the ring buffer 17; FIG. 18B shows SRC processing execution; and FIG. 18C shows execution of decimation processing.

As shown in FIGS. 18A, 18B and 18C, the first timing control circuit 121 controls the arithmetic circuit 11 to cause SRC processing of one processing unit that was commenced at time T0 to be concluded at time T51. The control circuit 13 monitors the amount of data to be transmitted by the input signal SA in real-time. In addition, when the data amount of one transmission unit stored in the ring buffer 17 is less than the amount of data to be SRC processed per processing unit, the control circuit 13 transmits to the first timing control circuit 121 a control signal CA1 that causes execution of unprocessing in SRC processing of the first control processing unit subsequent to time T51. Upon receiving the control signal CA1 that causes execution of unprocessing, the first timing control circuit 121 causes the arithmetic circuit 11 to execute unprocessing of SRC processing using a control signal C1 to the arithmetic circuit 11. In other words, the deficiency of data to be SRC processed may be resolved by reducing execution of actual processing of SRC on a per-control processing unit basis. Subsequently, the arithmetic circuit 11 alternately executes actual processing and unprocessing.

In addition, the control circuit 13 monitors the amount of SRC processed data in real-time, and when the amount of SRC processed data reaches a specified value, transmits a control signal CA2 to the timing control circuit 122. More specifically, at time T50 upon which the amount of SRC processed data reaches the amount of input data for decimation processing per processing unit, the control circuit 13 transmits the control signal CA2 to the second timing control circuit 122. Upon receiving the control signal CA2, the second timing control circuit 122 transmits a control signal C2 to the arithmetic circuit 11, whereby the arithmetic circuit 11 commences decimation processing. After the conclusion of decimation of one processing unit at time T52, the transmission of the control signal C2 from the second timing control circuit 122 to the arithmetic circuit 11 is stopped and the arithmetic circuit 11 stops decimation processing. Then, at time T53 upon which the amount of SRC processed data reaches the amount of input data for decimation processing per processing unit, the control signal CA2 is transmitted from the control circuit 13 to the second timing control circuit 122 and decimation processing is recommenced.

Next, a case will be considered in which data having a data amount of D6 is generated as excess data as shown in FIGS. 19A and 19B. Operations performed by the digital signal processing apparatus 1B in a case where excess data shown in FIGS. 19A and 19B is created will be described using the timing charts shown in FIGS. 20A, 20B and 20C. FIG. 20A shows storage of the input signal SA to become SRC processing input data to the ring buffer 17; FIG. 20B shows SRC processing execution; and FIG. 20C shows execution of decimation processing.

As shown in FIGS. 20A, 20B and 20C, the first timing control circuit 121 controls the arithmetic circuit 11 to cause SRC processing of one processing unit that was commenced at time T0 to be concluded at time T61. Data to be transmitted from the transmitting circuit 2 to the digital signal processing apparatus 1B during the period of time from time T61 to time T62 is excess data. In this case, time T62 is a point in time upon which a time equivalent to one period of the first sampling frequency f1 has lapsed from time T0. The control circuit 13 monitors the amount of data to be transmitted by the input signal SA in real-time. In addition, when the data amount of one transmission unit stored in the ring buffer 17 is greater than the amount of data to be SRC processed per processing unit, the control circuit 13 transmits to the first timing control circuit 121 a control signal CA1 that causes execution of actual processing in SRC processing of the first control processing unit subsequent to time T61. Upon receiving the control signal CA1 that causes execution of actual processing, the first timing control circuit 121 causes the arithmetic circuit 11 to execute actual processing of SRC processing using a control signal C1 to the arithmetic circuit 11. In other words, actual processing of SRC processing is increased per control processing unit to execute SRC processing of the excess data. Subsequently, the arithmetic circuit 11 alternately executes unprocessing and actual processing.

In addition, the control circuit 13 monitors the amount of SRC processed data in real-time, and when the amount of SRC processed data reaches a specified value, transmits a control signal CA2 to the timing control circuit 122. More specifically, at time T61 upon which the amount of SRC processed data reaches the amount of input data for decimation processing per processing unit, the control circuit 13 transmits the control signal CA2 to the second timing control circuit 122. Upon receiving the control signal CA2, the second timing control circuit 122 transmits a control signal C2 to the arithmetic circuit 11, whereby the arithmetic circuit 11 commences decimation processing. Decimation processing of one processing unit commenced at time T61 is controlled by the second timing control circuit 122 so as to conclude before time T63 that precedes time T64 that is one period of the first sampling frequency f1 after time T61. In other words, the period between time T63 and time T64 becomes an unprocessing period of decimation processing on data SRC processed prior to time T61. Then, at time T63, the control circuit 13 transmits a control signal CA2 to the second timing control circuit 122, whereby decimation processing is newly commenced. The generation of a deficiency in decimation processing result may be avoided by newly executing decimation from time T63 that is within the unprocessing period of decimation processing.

As described above, the digital signal processing apparatus 1B according to the fifth embodiment of the present invention controls the timing control circuit 12 for each control processing unit that is the processing unit split into a plurality of portions, in accordance with the magnitude relation between the first sampling frequency f1 and the second sampling frequency f2. Therefore, since whether SRC signal processing will be actually executed may be controlled on a per-control processing unit basis, in the event that excess or deficient data is generated with respect to SRC, such excess or deficient data may be resolved. As a result, SRC processing and decimation processing may be executed by one arithmetic circuit 11. Other features are substantially equal to those of the first to fourth embodiments, and overlapping descriptions will be omitted.

Other Embodiments

As seen, while the present invention has been described in the first to fifth embodiments thereof, the dissertations and diagrams forming portions of the present disclosure should not be understood to limit the present invention. Various modifications, embodiments and operational techniques shall be obvious to those skilled in the art.

While a case where the digital signal processing apparatus 1 executes interpolation or decimation and SRC processing has been presented in the above description of the first to fifth embodiments, other digital filter processing and SRC processing may be executed instead.

In addition, when input data for interpolation processing is inputted to the data buffer 16 in synchronization with the sampling frequency of the input signal SA and the write operation to the data buffer 16 is in synchronization with the operation clock of the transmitting circuit 2, the period of the write operation to the data buffer 16 and the operation clock of the digital signal processing apparatus 1 may be detected to set a ratio of the sampling rate during SRC.

As seen, it is obvious that the present invention includes various embodiments and the like not described herein. Therefore, the technical scope of the present invention is defined solely by specified matters of the present invention which are appropriate in view of the above description according to the claims.

According to the above-described plurality of embodiments, a digital signal processing apparatus and a digital signal processing method may be provided which are capable of suppressing increases in apparatus configuration required by digital signal processing in which the sampling frequencies of the input signal and the output signal differ.

Having described the embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A digital signal processing apparatus comprising:
   an arithmetic circuit configured to perform first digital signal processing on an input signal sampled at a first sampling frequency and second digital signal processing on a result of the first digital signal processing;
   a timing control circuit configured to control commencing timings to cause the arithmetic circuit to perform first and second digital signal processing; and
   a control circuit configured to monitor in real-time at least one of an amount of data subjected to the second digital signal processing and an amount of data to be transmitted by the input signal, and control the timing control circuit when the monitored data amount reaches a predetermined value.

2. The digital signal processing apparatus according to claim 1, wherein: when the first sampling frequency is greater than a second sampling frequency that generates an output signal, the control circuit controls the timing control circuit so that the first digital signal processing is newly commenced at a time upon which the amount of data subjected to the second digital signal processing reaches the amount of data to be subjected to the second digital signal processing per processing unit; and when the first sampling frequency is lower than the second sampling frequency, the control circuit controls the timing control circuit such that the point in time upon which the first digital signal processing is newly commenced is set so that the amount of data to be subjected to the first digital signal processing from the point in time until the time upon which the second digital signal processing currently in progress is concluded is equal to or greater than the difference between the amounts of data to be subjected to the first and second digital signal processing per processing unit.

3. The digital signal processing apparatus according to claim 2, wherein the second digital signal processing is sampling rate conversion.

4. The digital signal processing apparatus according to claim 1, wherein: when the first sampling frequency is lower than the second sampling frequency that generates an output signal, the control circuit controls the timing control circuit so that the first digital signal processing is newly commenced at a time upon which the amount of data to be transmitted by the input signal reaches the amount of data to be subjected to the first digital signal processing per processing unit; and when the first sampling frequency is greater than the second sampling frequency, the control circuit controls the timing control circuit such that the point in time upon which the first digital signal processing is newly commenced is set so that the amount of data to be transmitted by the input signal from the point in time until the time upon which the transmission currently in progress of data of one transmission unit is concluded is equal to or greater than the difference between the data amount of one transmission unit of the input signal and the amount of data to be subjected to the first digital signal processing per processing unit.

5. The digital signal processing apparatus according to claim 4, wherein the first digital signal processing is sampling rate conversion.

6. The digital signal processing apparatus according to claim 1, wherein the control circuit controls the timing control circuit for each control processing unit that is the processing unit split into a plurality of portions, in accordance with the magnitude relation between the first sampling frequency and the second sampling frequency that generates an output signal.

7. The digital signal processing apparatus according to claim 1, wherein the timing control circuit comprises: a first timing control circuit configured to transmit to the arithmetic circuit a control signal instructing the first digital signal processing of the input signal; and a second timing control circuit configured to transmit to the arithmetic circuit a control signal instructing the second digital signal processing of the result of the first digital signal processing.

8. The digital signal processing apparatus according to claim 7, wherein: when the first sampling frequency is greater than the second sampling frequency that generates an output signal, the control circuit controls the timing control circuit so that the first digital signal processing is newly commenced at a time upon which the amount of data subjected to the second digital signal processing reaches the amount of data to be subjected to the second digital signal processing per processing unit; and when the first sampling frequency is lower than the second sampling frequency, the control circuit controls the timing control circuit such that the point in time upon which the first digital signal processing is newly commenced is set so that the amount of data to be subjected to the first digital signal processing from the point in time until the time upon which the second digital signal processing currently in progress is concluded is equal to or greater than the difference between the amounts of data to be subjected to the first and second digital signal processing per processing unit.

9. The digital signal processing apparatus according to claim 8, wherein the second digital signal processing is sampling rate conversion.

10. The digital signal processing apparatus according to claim 7, wherein: when the first sampling frequency is lower than the second sampling frequency that generates an output signal, the control circuit controls the timing control circuit so that the first digital signal processing is newly commenced at a time upon which the amount of data to be transmitted by the input signal reaches the amount of data to be subjected to the first digital signal processing per processing unit; and when the first sampling frequency is greater than the second sampling frequency, the control circuit controls the timing control circuit such that the point in time upon which the first digital signal processing is newly commenced is set so that the amount of data to be transmitted by the input signal from the point in time until the time upon which the transmission currently in progress of data of one transmission unit is concluded is equal to or greater than the difference between the data amount of one transmission unit of the input signal and the amount of data to be subjected to the first digital signal processing per processing unit.

11. The digital signal processing apparatus according to claim 10, wherein the first digital signal processing is sampling rate conversion.

12. The digital signal processing apparatus according to claim 7, wherein the control circuit controls the timing control circuit for each control processing unit that is the processing unit split into a plurality of portions, in accordance with the magnitude relation between the first sampling frequency and the second sampling frequency that generates an output signal.

13. A digital signal processing apparatus comprising:
an arithmetic circuit configured to perform first digital signal processing on an input signal sampled at a first sampling frequency and second digital signal processing on a result of the first digital signal processing to generate an output signal sampled at a second sampling frequency;
a register configured to retain a ratio of the first sampling frequency to the second sampling frequency;
a timing control circuit configured to control commencing timings to cause the arithmetic circuit to perform first and second digital signal processing; and
a control circuit configured to monitor in real-time at least one of an amount of data subjected to the second digital signal processing and an amount of data to be transmitted by the input signal, and control the timing control circuit when the monitored data amount reaches a predetermined value.

14. The digital signal processing apparatus according to claim 13, wherein: when the first sampling frequency is greater than the second sampling frequency, the control circuit controls the timing control circuit so that the first digital signal processing is newly commenced at a time upon which the amount of data subjected to the second digital signal processing reaches the amount of data to be subjected to the second digital signal processing per processing unit; and when the first sampling frequency is lower than the second sampling frequency, the control circuit controls the timing control circuit such that the point in time upon which the first digital signal processing is newly commenced is set so that the amount of data to be subjected to the first digital signal processing from the point in time until the time upon which the second digital signal processing currently in progress is concluded is equal to or greater than the difference between the amounts of data to be subjected to the first and second digital signal processing per processing unit.

15. The digital signal processing apparatus according to claim 13, wherein: when the first sampling frequency is lower than the second sampling frequency, the control circuit controls the timing control circuit so that the first digital signal processing is newly commenced at a time upon which the amount of data to be transmitted by the input signal reaches the amount of data to be subjected to the first digital signal processing per processing unit; and when the first sampling frequency is greater than the second sampling frequency, the control circuit controls the timing control circuit such that the point in time upon which the first digital signal processing is newly commenced is set so that the amount of data to be transmitted by the input signal from the point in time until the time upon which the transmission currently in progress of data of one transmission unit is concluded is equal to or greater than the difference between the data amount of one transmission unit of the input signal and the amount of data to be subjected to the first digital signal processing per processing unit.

16. The digital signal processing apparatus according to claim 13, wherein the control circuit controls the timing control circuit for each control processing unit that is the processing unit split into a plurality of portions, in accordance with the magnitude relation between the first sampling frequency and the second sampling frequency stored in the register.

17. A method of processing a digital signal comprising:
generate a first digital signal by performing first digital signal processing on an input signal sampled at a first sampling frequency at an arithmetic circuit based on a first control signal received from a timing control circuit; and
generate an output signal by performing second digital signal processing on the first digital signal at the arithmetic circuit based on a second control signal received from the timing control circuit, wherein
at least one of an amount of data subjected to the second digital signal processing and an amount of data to be transmitted by the input signal is monitored in real-time by a control circuit, and when the monitored data amount reaches a predetermined value, the control circuit outputs control signal to the timing control circuit, whereby, based on the control signal, the first control signal and/or the second control signal is outputted from the timing control circuit to the arithmetic circuit and commencing timings to cause the arithmetic circuit to perform the first and second digital signal processing are controlled.

18. The method of processing a digital signal according to claim 17, wherein: when the first sampling frequency is greater than the second sampling frequency that generates the output signal, the control circuit controls the timing control circuit so that the first digital signal processing is newly commenced at a time upon which the amount of data subjected to the second digital signal processing reaches the amount of data to be subjected to the second digital signal processing per processing unit; and when the first sampling frequency is lower than the second sampling frequency, the control circuit controls the timing control circuit such that the point in time upon which the first digital signal processing is newly commenced is set so that the amount of data to be subjected to the first digital signal processing from the point in time until the time upon which the second digital signal processing currently in progress is concluded is equal to or greater than the difference between the amounts of data to be subjected to the first and second digital signal processing per processing unit.

19. The method of processing a digital signal according to claim 17, wherein: when the first sampling frequency is lower than the second sampling frequency that generates the output signal, the control circuit controls the timing control circuit so that the first digital signal processing is newly commenced at a time upon which the amount of data to be transmitted by the input signal reaches the amount of data to be subjected to the first digital signal processing per processing unit; and when the first sampling frequency is greater than the second sampling frequency, the control circuit controls the timing control circuit such that the point in time upon which the first digital signal processing is newly commenced is set so that the amount of data to be transmitted by the input signal from the point in time until the time upon which the transmission currently in progress of data of one transmission unit is concluded is equal to or greater than the difference between the data amount of one transmission unit of the input signal and the amount of data to be subjected to the first digital signal processing per processing unit.

20. The method of processing a digital signal according to claim 17, wherein the control circuit controls the timing control circuit for each control processing unit that is the processing unit split into a plurality of portions, in accordance with the magnitude relation between the first sampling frequency and the second sampling frequency that generates the output signal.

* * * * *